United States Patent
Kawai et al.

(10) Patent No.: US 7,892,934 B2
(45) Date of Patent: Feb. 22, 2011

(54) SOI SUBSTRATE AND METHOD FOR MANUFACTURING SOI SUBSTRATE

(75) Inventors: Makoto Kawai, Gunma (JP); Yoshihiro Kubota, Gunma (JP); Atsuo Ito, Gunma (JP); Koichi Tanaka, Gunma (JP); Yuuji Tobisaka, Gunma (JP); Shoji Akiyama, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/158,047

(22) PCT Filed: Nov. 1, 2006

(86) PCT No.: PCT/JP2006/321885

§ 371 (c)(1),
(2), (4) Date: Sep. 24, 2009

(87) PCT Pub. No.: WO2007/072632

PCT Pub. Date: Jun. 28, 2007

(65) Prior Publication Data

US 2010/0025804 A1    Feb. 4, 2010

(30) Foreign Application Priority Data

Dec. 20, 2005    (JP) .............................. 2005-366142

(51) Int. Cl.
*H01L 21/331* (2006.01)
*H01L 21/8222* (2006.01)

(52) U.S. Cl. ...................... 438/311; 438/509; 438/514; 438/475; 257/E21.32; 257/E21.082; 257/E21.121; 257/E21.248; 257/E21.304; 257/E21.311; 257/E21.319

(58) Field of Classification Search ................. 438/311, 438/97, 149, 197, 505, 509, 513, 474, 475, 438/514, 30, 752; 257/E21.32, 82, 121, 248, 257/304, 311, 319
See application file for complete search history.

(56) References Cited

U.S. PATENT DOCUMENTS 6,388,290 B1 *  5/2002  Celler et al. ................. 257/350

(Continued)

FOREIGN PATENT DOCUMENTS

EP    0 961 312 A2    12/1999

(Continued)

OTHER PUBLICATIONS

U.S. Appl. No. 12/161,819, filed Jul. 23, 2008, Akiyama, et al.

(Continued)

*Primary Examiner*—David Nhu
(74) *Attorney, Agent, or Firm*—Oblon, Spivak, McClelland, Maier & Neustadt, L.L.P.

(57) ABSTRACT

On the side of a surface (the bonding surface side) of a single crystal Si substrate, a uniform ion implantation layer is formed at a prescribed depth (L) in the vicinity of the surface. The surface of the single crystal Si substrate and a surface of a transparent insulating substrate as bonding surfaces are brought into close contact with each other, and bonding is performed by heating the substrates in this state at a temperature of 350° C. or below. After this bonding process, an Si—Si bond in the ion implantation layer is broken by applying impact from the outside, and a single crystal silicon thin film is mechanically peeled along a crystal surface at a position equivalent to the prescribed depth (L) in the vicinity of the surface of the single crystal Si substrate.

10 Claims, 2 Drawing Sheets

U.S. PATENT DOCUMENTS

| | | | |
|---|---|---|---|
| 6,537,370 B1 * | 3/2003 | Hernandez et al. | 117/88 |
| 6,720,237 B2 * | 4/2004 | Iwasaki et al. | 438/458 |
| 7,112,514 B2 * | 9/2006 | Yasukawa | 438/459 |
| 2004/0229444 A1 | 11/2004 | Couillard et al. | |
| 2004/0232488 A1 | 11/2004 | Forbes | |
| 2004/0241958 A1 | 12/2004 | Guarini et al. | |

FOREIGN PATENT DOCUMENTS

| | | |
|---|---|---|
| JP | 6 18926 | 1/1994 |
| JP | 11 145438 | 5/1999 |
| JP | 11 163363 | 6/1999 |
| JP | 3048201 | 6/2000 |
| JP | 2002 110998 | 4/2002 |
| JP | 2003 282885 | 10/2003 |
| JP | 2003 347526 | 12/2003 |
| JP | 2004 503111 | 1/2004 |
| JP | 2004 63730 | 2/2004 |
| WO | 03 049189 | 6/2003 |
| WO | 2005 027214 | 3/2005 |
| WO | WO 2005/029576 A2 | 3/2005 |
| WO | WO 2005/029576 A3 | 3/2005 |

OTHER PUBLICATIONS

U.S. Appl. No. 12/162,134, filed Jul. 25, 2008, Akiyama, et al.
U.S. Appl. No. 12/161,694, filed Jul. 22, 2008, Akiyama, et al.
U.S. Appl. No. 12/161,821, filed Jul. 23, 2008, Akiyama, et al.

* cited by examiner

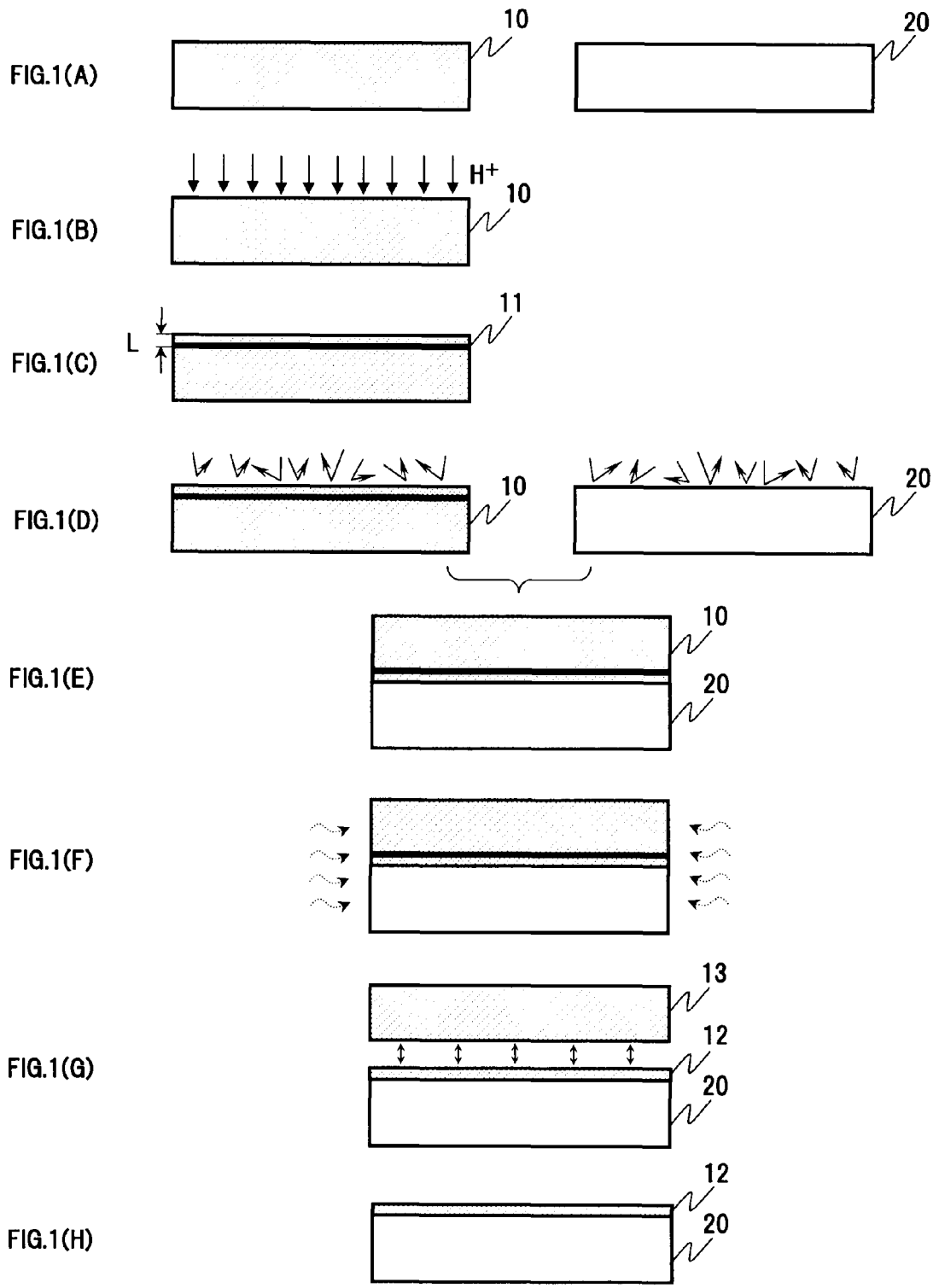

SOI SUBSTRATE AND METHOD FOR MANUFACTURING SOI SUBSTRATE

CROSS REFERENCE TO RELATED APPLICATION

This application is a 371 of PCT/JP06/321885, filed on Nov. 1, 2006, and claims priority to Japanese Patent Application No. 2005-366142, filed on Dec. 20, 2005.

TECHNICAL FIELD

The present invention relates to an SOI substrate and a method for manufacturing an SOI substrate and, more particularly, to an SOI substrate in which a peeled surface of a single crystal silicon thin film bonded and formed on a transparent insulating substrate has suppressed surface roughness and a method for manufacturing the SOI substrate.

BACKGROUND ART

A so-called SOI (Silicon on Insulator) wafer, in which a single crystal silicon (Si) layer is provided on an insulating film such as an oxide film, is used as a substrate for device formation for the purpose of forming a MOS transistor excellent in radiation-resistant characteristics and latch-up characteristics and excellent at suppressing the short channel effect. Among SOI substrates, a less-defective SOI substrate to which a bonding technique has been applied is attracting attention. The use of such an SOI substrate as a substrate for optical device manufacture has come under review in recent years (e.g., Patent Documents 1 to 5).

Among methods for driving electro-optic devices, including a liquid crystal display panel (LCD), an active matrix method is a driving method which is commonly used for the reason that high definition is achieved due to high response speed if the method is applied to a display device and for other reasons.

The general configuration of such an active-matrix-driven electro-optic device is such that a liquid crystal layer is provided by sandwiching liquid crystal between two glass substrates of upper and lower glass substrates and that an upper electrode (counter electrode) common to the whole pattern is formed on the upper glass electrode while pixel electrodes and TFTs as switching elements for driving the respective pixel electrodes are provided on the lower glass substrate. An X electrode as a gate input unit of the TFT provided for each pixel and a Y electrode as a source input unit are patterned on the lower glass substrate. The input of an electrical signal to each TFT is controlled through these electrodes. With this control, each TFT as the switching element is controlled. Liquid crystal in an area between each pixel electrode and the counter electrode changes in orientation depending on the electric field generated between the upper and lower electrodes and functions as a liquid crystal shutter. That is, each pixel is driven by turning on/off the corresponding TFT as a switching element for a liquid crystal shutter.

Such a TFT has conventionally been provided in an amorphous Si (a-Si) or polycrystalline Si (poly-Si) film provided on a lower glass substrate. Since a TFT as a switching element is required to operate at high speed for high-speed control of pixel switching, the use of a single crystal Si TFT instead of an amorphous Si TFT or polycrystalline Si TFT has been considered, and the use of an SOI substrate having a single crystal silicon thin film on an insulating substrate has been considered. In other words, formation of TFTs in a single crystal Si layer provided on an insulator layer by means of bonding or the like allows much faster switching than the case of amorphous Si TFTs or polycrystalline Si TFTs.

Patent Document 1: Japanese Patent Laid-Open No. 11-145438
Patent Document 2: Japanese Patent Laid-Open No. 6-18926
Patent Document 3: Japanese Patent Laid-Open No. 11-163363
Patent Document 4: Japanese Patent Laid-Open No. 2003-282885
Patent Document 5: Japanese Patent Laid-Open No. 2002-110998
Patent Document 6: Japanese Patent No. 3048201

DISCLOSURE OF THE INVENTION

When an SOI substrate is to be used as a substrate for an optical device as described above, the SOI substrate needs to have a single crystal silicon thin film on a transparent insulating substrate. To form an electronic device such as a TFT in the single crystal silicon thin film, the single crystal silicon thin film is required to be a high-quality film with advantages such as high surface flatness, excellent in-plane film thickness uniformity, and few structural defects which may cause light scattering.

In a conventional SOI substrate manufacturing method (e.g., a method disclosed in Patent Document 6), a relatively high temperature (e.g., 500 to 1,200° C.) is adopted in heat treatment during a manufacturing process.

Even under such a condition, if the differences in thermal expansion coefficient and mechanical strength (a modulus of rigidity or the like) between a single crystal silicon substrate and a substrate to be bonded thereto are relatively small, a thin-film single crystal silicon layer with a relatively flat surface can be obtained.

However, if an SOI substrate is manufactured by bonding together a single crystal silicon substrate and a transparent insulating substrate (e.g., a quartz substrate), since the differences in thermal expansion coefficient and mechanical strength (a modulus of rigidity or the like) between the two substrates to be bonded together are large, heat treatment at a high temperature as described above causes trouble. More specifically, an undesirable phenomenon such as a fracture in a one with lower rigidity of the substrates (often the transparent insulating substrate) or local peeling at bonding surfaces may occur. Alternatively, a microcrack in an area in the vicinity of the bonding surface of the single crystal silicon substrate may prevent smooth cleavage when thin-film single crystal silicon layer (SOI layer) is peeled to cause surface roughness.

The present invention has been made to meet the above-described demand, and has as its object to provide an SOI substrate comprising an SOI layer formed on a transparent insulating substrate by a bonding technique, wherein a peeled surface of the SOI layer has high flatness.

In order to solve the above-described problem, a method for manufacturing an SOI substrate according to the present invention comprises a first step of forming a hydrogen ion implantation layer at an average ion implantation depth L on one principal surface of a single crystal silicon substrate, a second step of subjecting at least one of one principal surface of a transparent insulating substrate and the one principal surface of the single crystal silicon substrate to surface treatment, a third step of bringing the one principal surface of the single crystal silicon substrate and the one principal surface of the transparent insulating substrate into close contact with each other, a fourth step of subjecting the single crystal silicon substrate and transparent insulating substrate to bonding by heating the single crystal silicon substrate and transparent insulating substrate at a temperature of 350° C. or below while the single crystal silicon substrate and transparent insulating substrate are in close contact with each other, and a fifth step of mechanically peeling a single crystal silicon thin film along a crystal surface at a position equivalent to the average ion implantation depth L and forming an SOI layer on the transparent insulating substrate.

Preferably, a heat treatment temperature in the above-described fourth step is preferably 100 to 300° C.

A dose of hydrogen ions in the above-described first step is preferably $0.5 \times 10^{17}$ atoms/cm$^2$ or above, more preferably $1 \times 10^{17}$ atoms/cm$^2$ or above.

The dose of hydrogen ions in the above-described first step is preferably $3 \times 10^{17}$ atoms/cm$^2$ or below.

In the present invention, the above-described transparent insulating substrate is preferably one of a quartz substrate, a sapphire (alumina) substrate, a borosilicate glass substrate, and a crystallized glass substrate.

In the present invention, the above-described single crystal silicon substrate is preferably a substrate of nearly perfect crystal (NPC), single crystal silicon grown by a CZ method (Czochralski method) or a floating zone method (FZ method).

The surface treatment in the above-described second step preferably comprises at least one of plasma treatment and ozone treatment.

An RMS value for the roughness of a peeled surface of the above-described SOI layer is preferably 10 nm or below, more preferably 6 nm or below.

In the present invention, the temperature for bonding of a transparent insulating substrate and a single crystal Si substrate after formation of a hydrogen ion implantation layer is set to 350° C. or below. Accordingly, the amount of thermal distortion induced during a corresponding heat treatment process is suppressed, and an undesirable phenomenon due to the differences in physical property values between the single crystal Si substrate and the transparent insulating substrate, such as a substrate fracture or local peeling at bonding surfaces, can be avoided.

Since a heat treatment temperature of 350° C. or below is sufficiently low compared to a temperature required to change the state of bonds of a silicon atom, local damage in the hydrogen ion implantation layer induced by ion implantation is maintained during a corresponding heat treatment process. It is thus possible to obtain an SOI layer with suppressed surface roughness after peeling.

An SOI substrate thus obtained is excellent in surface flatness and in-plane film thickness uniformity and has few structural defects which cause light scattering. Therefore, it is possible to provide an SOI substrate especially suitable for manufacturing an optical device.

BRIEF DESCRIPTION OF THE DRAWINGS

FIGS. 1(A)-1(H) show views for explaining an example of a manufacturing process for an SOI substrate according to the present invention;

BEST MODE FOR CARRYING OUT THE INVENTION

Figure 2A:
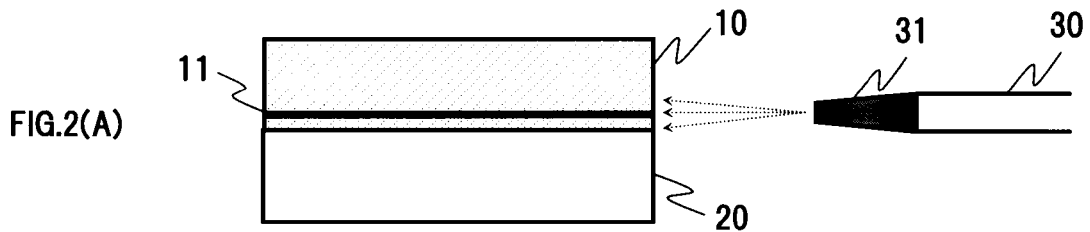
FIGS. 2(A) and 2(B) show views for illustrating a method for applying impact from the outside in a peeling process according to the present invention.

The best mode for carrying out the present invention will be described below with reference to the drawings.

In the present invention, the temperature for bonding of one principal surface of a transparent insulating substrate and a single crystal Si substrate having a hydrogen ion implantation layer formed in advance at an average ion implantation depth of one principal surface is set to 350° C. or below, preferably 100 to 300° C.

As the transparent insulating substrate, a quartz substrate, a sapphire (alumina) substrate, a borosilicate glass substrate, a crystallized glass substrate, or the like is selected. These substrates are relatively significantly different in thermal expansion coefficient and mechanical strength (a modulus of rigidity or the like) from the single crystal Si substrate, and a fracture or local peeling at bonding surfaces is likely to occur due to heat in a bonding process. Accordingly, the present invention suppresses the amount of induced thermal distortion by selecting a temperature of 350° C. or below as a bonding temperature and avoids the above-described undesirable phenomenon due to the differences in physical property values between the single crystal Si substrate and the transparent insulating substrate.

Since the heat treatment temperature of 350° C. or below is sufficiently low compared to a temperature required to change the state of bonds of a silicon atom, local damage in the hydrogen ion implantation layer induced by hydrogen ion implantation is maintained during a corresponding heat treatment process. For this reason, there occurs no microcrack or the like which may act as the origin of cleavage of a single crystal silicon thin film in a subsequent peeling process. As a result, the hydrogen ion-implanted state as a cleavage condition is maintained, and it is possible to obtain an SOI layer with suppressed surface roughness after peeling.

In the present invention, the upper limit for the dose of hydrogen ions to be implanted into the single crystal Si substrate is set to $3 \times 10^{17}$ atoms/cm$^2$. The upper limit is set to avoid a reduction in productivity but also because the dose at or above the value causes too much damage at the time of ion implantation, and consequently the number of cleavage origins formed in the single crystal silicon thin film becomes excessive to be prone to surface roughness in the SOI layer after peeling.

Note that a value sufficient to cause damage required for cleavage to the single crystal silicon thin film is selected as the lower limit for the dose of hydrogen ions to be implanted and that the lower limit is preferably $0.5 \times 10^{17}$ atoms/cm$^2$ or above, more preferably $1 \times 10^{17}$ atoms/cm$^2$ or above.

The present invention will be more specifically described below through examples. It is, of course, understood that the present invention is not limited to these examples. For the sake of descriptive simplicity, assume that a transparent insulating substrate to be bonded is a quartz substrate.

Example 1

FIGS. 1(A)-1(H) show views for explaining an example of a manufacturing process for an SOI substrate according to the present invention. First, a single crystal Si substrate 10 and a transparent insulating substrate 20 having the same diameter are prepared (FIG. 1(A)). The single crystal Si substrate 10 is a commercially available Si substrate which is formed through growth by, e.g., the CZ method (Czochralski method). The electrical characteristics such as conductivity type and resistivity, crystal orientation, and crystal diameter of the single crystal Si substrate 10 are appropriately selected depending on design values and processes for a device for which an SOI substrate according to the present invention is used or the display area of a device to be manufactured and the like.

As the single crystal Si substrate, a substrate of "nearly perfect crystal (NPC)", single crystal silicon grown by the CZ method (Czochralski method) or the floating zone method (FZ method) may be used instead. Note that it is preferable to form, in the transparent insulating substrate 20, an orientation flat (OF) similar to one formed in the single crystal Si substrate 10 for convenience in a subsequent device forming process and bond together the substrates such that the OFs coincide with each other.

On the side of a surface (the bonding surface side) of the single crystal Si substrate 10, hydrogen ions are implanted such that an SOI layer with a prescribed thickness will be obtained in a subsequent process (FIG. 1(B)). A uniform ion implantation layer 11 is formed at a prescribed depth (an average ion implantation depth L) in the vicinity of the surface of the single crystal Si substrate 10 (FIG. 1(C)). A depth from the surface of the single crystal Si substrate 10 at which the ion implantation layer 11 is located (the average ion implantation depth L) is controlled by an acceleration voltage at the time of the ion implantation. With this ion implantation, a microbubble layer is formed in an area equivalent to the average ion implantation depth L at the surface of the single crystal Si substrate 10 to be localized in the area.

The ion implantation depth L depends on how much thickness of the SOI layer is to be peeled. For example, the average ion implantation depth L for hydrogen ions is set to 0.5 μm or below, and ion implantation conditions are set as follows: dose, $0.5 \times 10^{17}$ to $3 \times 10^{17}$ atoms/cm$^2$; and acceleration voltage, 50 to 100 keV.

The temperature of the single crystal Si substrate 10 at the time of the ion implantation is kept at about 250 to 450° C. Note that an insulating film such as an oxide film may be formed in advance on an ion implantation surface of the single crystal Si substrate 10, and ions may be implanted through the insulating film, as generally performed to suppress channeling of implanted ions in the process of implanting ions into Si crystals.

Bonding surfaces of the single crystal Si substrate 10 having the thus-formed ion implantation layer 11 and the transparent insulating substrate 20 are subjected to plasma treatment or ozone treatment aimed at surface cleaning, surface activation, and the like (FIG. 1(D)). Note that such surface treatment is performed for the purpose of removing organic matter from a surface serving as a bonding surface, for the purpose of achieving surface activation by increasing OH groups on the surface, or for another purpose. It is not always necessary to subject both the bonding surfaces of the single crystal Si substrate 10 and transparent insulating substrate 20 to the treatment, and only one of the bonding surfaces may be subjected to the treatment.

If the surface treatment is performed by plasma treatment, a single crystal Si substrate and/or a transparent insulating substrate with clean surfaces which have been subjected in advance to RCA cleaning or the like are placed on a sample stage in a vacuum chamber, and plasma gas is introduced into the vacuum chamber such that a prescribed degree of vacuum is achieved. Note that examples of the plasma gas used here as a gas for the surface treatment of the single crystal Si substrate include oxygen gas, hydrogen gas, argon gas, a mixture of these, and a mixture of hydrogen gas and helium gas. The gas used can be appropriately changed depending on the surface state of the single crystal Si substrate, the purpose, and the like.

If the surface treatment is also intended to oxidize the single crystal Si surface, gas containing at least oxygen gas is used as the plasma gas. Note that if a substrate whose surfaces are oxidized such as a quartz substrate is used as the transparent insulating substrate, there is no specific limit on the type of the plasma gas to be selected. After the plasma gas is introduced, radio-frequency plasma with a power of about 100 W is generated. The surface(s) of the single crystal Si substrate and/or insulating substrate to be plasma-treated is (are) subjected to treatment for about 5 to 10 seconds, and the surface treatment ends.

If the surface treatment is performed by ozone treatment, a single crystal Si substrate and/or a transparent insulating substrate with clean surfaces which have been subjected in advance to RCA cleaning or the like are placed on a sample stage in a chamber in an atmosphere containing oxygen. After plasma gas such as nitrogen gas or argon gas is introduced into the chamber, radio-frequency plasma with a prescribed power is generated. Oxygen in the atmosphere is converted to ozone by the plasma, and the surface(s) of the single crystal Si substrate and/or transparent insulating substrate to be treated are subjected to the treatment for a prescribed period.

The surfaces as the bonding surfaces of the single crystal Si substrate 10 and transparent insulating substrate 20 having undergone the above-described surface treatment are brought into close contact with each other (FIG. 1(E)). Bonding is performed by heating the single crystal Si substrate 10 and transparent insulating substrate 20 at a temperature of 350° C. or below in this state (FIG. 1(F)).

The temperature of 350° C. or below is selected in consideration of the difference in thermal expansion coefficient between single crystal Si and quartz, the amount of distortion due to the difference in thermal expansion coefficient, the amount of distortion, and the thicknesses of the single crystal Si substrate 10 and transparent insulating substrate 20. Assume that the thickness of the single crystal Si substrate 10 and that of the transparent insulating substrate 20 are approximately the same. Since the thermal expansion coefficient ($2.33 \times 10^{-6}$) of single crystal Si and that ($0.6 \times 10^{-6}$) of quartz are significantly different, if the single crystal Si substrate 10 and transparent insulating substrate 20 are subjected to heat treatment at a temperature above 350° C., the difference in rigidity between both the substrates may cause a crack due to thermal distortion or peeling at the bonding surfaces or may cause a fracture in the single crystal Si substrate or quartz substrate in an extreme case. For this reason, 350° C. is selected as the upper limit for the heat treatment temperature, and the heat treatment is preferably performed in the temperature range of 100 to 300° C.

The surface (bonding surface) of at least one of the single crystal Si substrate 10 and the transparent insulating substrate 20 is subjected to surface treatment by the above-described plasma treatment or ozone treatment, or the like and is activated. It is thus possible to achieve bonding strength enough to endure mechanical peeling and mechanical polishing in subsequent processes without high-temperature heat treatment required for a conventional bonding SOI manufacturing process. Accordingly, occurrence of thermal distortion, cracks, peeling at the bonding surfaces, and the like caused by the differences in thermal expansion coefficient and mechanical strength properties between the single crystal Si substrate 10 and the transparent insulating substrate 20 are suppressed at the time of heat treatment at a high temperature.

Experiments by the present inventors have confirmed that even if the single crystal Si substrate 10 and transparent insulating substrate 20 are simply brought into close contact with each other at room temperature without any heat treatment, the strength of bonding therebetween is at a level enough to endure the mechanical peeling and mechanical polishing in the subsequent processes. Additionally, there is no specific limit on an atmosphere at the time of the close bonding and the pressure of the atmosphere.

After the above-described bonding process, an Si—Si bond in the ion implantation layer 11 is broken by applying impact from the outside, and a single crystal silicon thin film is mechanically peeled along a crystal surface at a position equivalent to the prescribed depth (average ion implantation depth L) in the vicinity of the surface of the single crystal Si substrate 10. With this operation, an SOI layer 12 is peeled from a bulk portion 13 of the single crystal Si substrate 10 while being bonded on the one principal surface of the transparent insulating substrate 20 (FIG. 1(G)), and an SOI substrate including the SOI layer 12 on the principal surface of the transparent insulating substrate 20 is obtained (FIG. 1(H)).

Note that there is no specific limit on an atmosphere at the time of the mechanical peeling and sample temperature and that the peeling may also be performed at room temperature in the air. Alternatively, the mechanical peeling may be performed while the sample is kept at a temperature free from the risk of significant thermal distortion, cracks, peeling at the bonding surfaces, and the like.

Figure 2B:
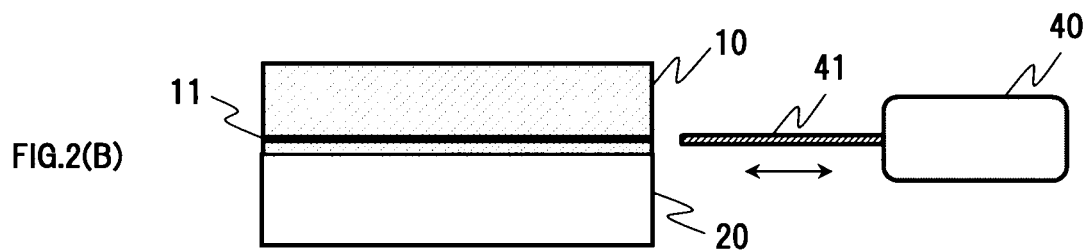

FIGS. 2(A) and 2(B) show views for illustrating a method for applying impact from the outside in the above-described peeling process. There are available various methods for applying impact. For example, a method for applying impact by causing fluid such as gas or liquid to issue in a jet from a tip portion 31 of a nozzle 30 and spraying the fluid on a side surface of the single crystal Si substrate 10 (FIG. 2(A)), a method for applying impact by pressing a tip portion 41 of a blade 40 against an area in the vicinity of the ion implantation layer 11 (FIG. 2(B)), or the like can be employed.

The surface roughness of any SOI layer after peeling according to this example obtained in the above-described manner was 10 nm or below in RMS value. It was possible to obtain an SOI layer with an RMS value of 6 nm or below by optimizing the heat treatment temperature condition in the above-described bonding process and the hydrogen ion implantation conditions. Note that an RMS value is an average value obtained by measuring a 10 μm×10 μm area on the surface of an SOI layer after peeling with an atomic force microscope (AFM).

As described above, the present invention does not require high-temperature processing as in a conventional method in either of the process of bonding the single crystal Si substrate 10 and transparent insulating substrate 20 and the process of peeling the SOI layer, and processing can be consistently performed at a low temperature (350° C. or below). Many of SOI substrate manufacturing methods known in the art include a high-temperature processing process and require a special contrivance to avoid cracks due to thermal distortion or peeling. A reduction in process temperature according to the present invention is extremely advantageous in terms of stabilization and simplification of an SOI substrate manufacturing process.

For example, Patent Document 1 (Japanese Patent Laid-Open No. 11-145438) discloses a method in which a single crystal Si wafer and an insulating substrate are heated at 100 to 300° C. and are temporarily bonded together, the single crystal Si layer is thinned by etching, the single crystal Si wafer and insulating substrate are subjected to heat treatment at 350 to 450° C. and are finally bonded together, the single crystal Si layer is further thinned by polishing, the single crystal Si wafer and insulating substrate are heated at 500° C. or above, thereby causing hydrogen embrittlement in an ion implantation layer, and peeling is performed at the ion implantation layer as a cleavage surface, in order to suppress occurrence of thermal distortion, peeling, cracks, and the like due to the difference in thermal expansion coefficient when bonding together the single crystal Si wafer and insulating substrate. However, even if the problem of peeling and cracks is solved by this procedure, the number of processes for the manufacture of an SOI substrate increases, and processes themselves inevitably become complicated.

In contrast with this, in a low-temperature process adopted by the present invention, a temperature reduction can be achieved in either of the bonding process and peeling process. The low-temperature process thus has the major advantage of being able to simultaneously realize simplification and stabilization of an SOI wafer manufacturing process.

Note that a heat treatment process may be further added after the peeling process in FIG. 1(G), as needed, to further improve the strength of bond between the SOI layer 12 and the transparent insulating substrate 20. Since the thickness of the SOI layer 12 immediately after the peeling process in FIG. 1(G) is generally 0.5 μm or below, even if the transparent insulating substrate 20 having the Si layer with this thickness at its surface is heat-treated at a relatively high temperature, a problem such as a fracture in the transparent insulating substrate 20 or peeling of the SOI layer 12 does not occur. Accordingly, the heat treatment temperature in this process can be set to a relatively high temperature, and the heat treatment can be performed in the temperature range of, e.g., about 1,000 to 1,250° C.

Basic processes of a method for manufacturing an SOI substrate according to the present invention are as illustrated in FIG. 1. The surface of the obtained SOI layer 12 may be subjected to mechanical polishing such as touch polishing.

Figure 3A:
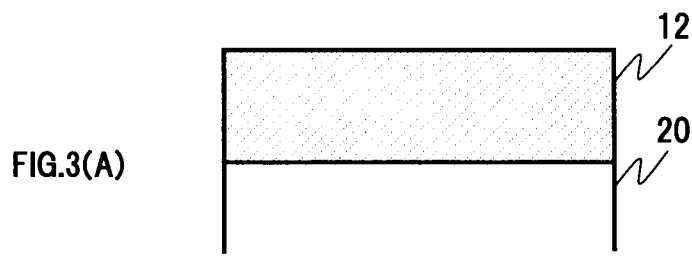
FIGS. 3(A)-3(C) show views for explaining a mechanical polishing process provided as needed.
Figure 3B:
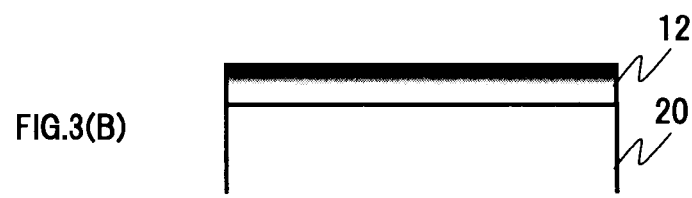
Figure 3C:
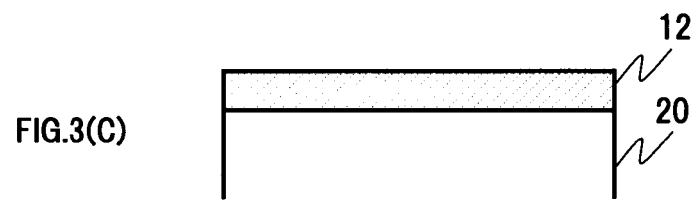

FIGS. 3(A)-3(C) show views for explaining a mechanical polishing process provided as needed. In the example shown in FIG. 3(A), the film thickness of the SOI layer 12 immediately after the peeling process is about 0.3 μm. The SOI layer is thinned to approximately 0.1 μm by mirror-polishing the surface of the SOI layer by the same procedure as that for mirror polishing in a normal Si substrate manufacturing process. With this mirror finishing, surface roughness such as haze generated on the surface of the SOI layer 12 in the peeling process is removed.

FIG. 3(B) shows the state of the SOI layer 12 after the above-described mirror polishing process. In the SOI layer 12 in this state, the thickness has been reduced to approximately 0.1 μm, and the surface roughness induced in the previous process has been removed, by the mirror polishing. However, remaining damage or crystal defects induced by the implantation of hydrogen ions and slight damage induced by the mirror polishing are in the Si crystal lattice of the SOI layer 12.

A microscopic lattice defect due to such damage itself may act as a carrier recombination center to affect the behavior of carriers. The microscopic lattice defect may also develop into a macroscopic defect such as a dislocation after heat treatment in a subsequent device manufacturing process and become a remote cause of degradation in the electrical characteristics of a device. For this reason, it is necessary to perform a process for removing the above-described damage in the SOI layer 12. Note that such damage can be removed by heat treatment using, e.g., a heat treatment furnace or lamp heater.

FIG. 3(C) illustrates a case where the above-described damage removal has been performed across the SOI layer 12. The damage in the SOI layer 12 has been wholly removed by heat treatment. Note that the removal of the damage from the SOI layer can be simply and quickly monitored by carrier lifetime measurement or the like. Such damage removal removes lattice distortion, a lattice defect, or the like which acts as a carrier recombination center (trapping center) in Si crystals and restores the electrical characteristics (carrier mobility, lifetime, and the like) of the SOI layer 12 to original values.

Example 2

Although an insulating layer such as a thermal oxide film is not provided on the bonding surface of the single crystal Si substrate used in Example 1, an SOI layer may be formed using a single crystal Si substrate having an oxide film formed in advance on a surface.

A single crystal Si substrate used in this example is one having a thermal oxide film with a thickness of 100 nm formed on the side of a bonding surface and having a diameter of 200 nm (8 inches). Note that the surface roughness of the thermal oxide film was expressed as an Ra value for a 10 µm×10 µm measurement area obtained by an atomic force microscope and was 0.2 nm.

As a transparent insulating substrate to be bonded to the single crystal Si substrate, a quartz substrate with a diameter of 200 mm (8 inches) is used. A bonding surface of the transparent insulating substrate is subjected to polishing, and the surface roughness thereof is 0.19 nm in Ra value. Note that a surface roughness measurement condition is the same as that for the above-described thermal oxide film.

Hydrogen ions were implanted from the side of the thermal oxide film into the single crystal Si substrate at an acceleration voltage of 35 KeV with a dose of $2.5 \times 10^{17}$ atoms/cm$^2$. The average hydrogen ion implantation depth from the interface between the thermal oxide film and the single crystal Si substrate at this time is 0.3 µm.

After both the single crystal Si substrate having undergone the hydrogen ion implantation and the quartz substrate were subjected to normal RCA cleaning, both the substrates were set in a chamber for plasma treatment, and plasma gas (air) was introduced into the chamber. The pressure in the chamber was then set to 2 torr. Under this reduced pressure, a 13.56 MHz radio frequency was applied across parallel plate electrodes having a diameter of 300 mm with a radio-frequency power of about 100 W. The bonding surfaces of the single crystal Si substrate and quartz substrate were subjected to radio-frequency plasma treatment for 5 to 10 seconds.

After the plasma treatment, the single crystal Si substrate and quartz substrate were put together and were brought into close contact with each other. Bonding was started by firmly pressing these substrates against each other with fingers. Since the bonding surfaces of both the substrates having undergone the plasma treatment were activated, high bonding strength would have been achieved even by such an extremely simple method. However, to further increase the bonding strength, the substrates were subjected to heat treatment at 250° C. for 30 hours while the substrates were bonded together. Visual observation of the bonding surfaces after the heat treatment confirmed uniform bonding of the substrates across the bonding surfaces. Note that although external force was applied with fingers to cause a shift between the substrates parallel to the bonding surfaces, the two substrates were not shifted relative to each other, and the state of bonding between the substrates remained unchanged.

Blades of paper cutting scissors were used for peeling to form an SOI layer. When the blades of the paper cutting scissors as a wedge were driven in the outer peripheral surface of the bonded substrates (the side surface of the substrates) at eight positions (at approximately 45° intervals), uniform peeling occurred across the bonded substrates, and an SOI layer which was a single crystal Si thin film was transferred and formed on the quartz substrate. The surface roughness of the SOI layer after the peeling was expressed as a Ra value for a 10 µm×10 µm measurement area obtained by an atomic force microscope and was 5.8 nm.

INDUSTRIAL APPLICABILITY

According to the present invention, it is possible to provide a bonding SOI substrate having a single crystal silicon thin film on a transparent insulating substrate, wherein a peeled surface of an SOI layer formed on the transparent insulating substrate has high flatness.

The SOI substrate is excellent in surface flatness and in-plane film thickness uniformity and has few structural defects which cause light scattering. Therefore, the SOI substrate is an SOI substrate especially suitable for manufacturing an optical device.

The invention claimed is:

1. A method for manufacturing an SOI substrate by bonding, characterized by comprising:
   forming a hydrogen ion implantation layer at an average ion implantation depth L on one principal surface of a single crystal silicon substrate;
   subjecting at least one of one principal surface of a transparent insulating substrate and the one principal surface of the single crystal silicon substrate to surface treatment;
   bringing the one principal surface of the single crystal silicon substrate and the one principal surface of the transparent insulating substrate into close contact with each other;
   bonding the single crystal silicon substrate and the transparent insulating substrate by heating the single crystal silicon substrate and the transparent insulating substrate at a temperature of 350° C. or below while the single crystal silicon substrate and the transparent insulating substrate are in close contact with each other; and
   mechanically peeling a single crystal silicon thin film along a crystal surface at a position equivalent to the average ion implantation depth L and forming an SOI layer on the transparent insulating substrate.

2. The method according to claim 1, wherein a heat treatment temperature during said subjecting is 100 to 300° C.

3. The method according to claim 1, wherein a dose of hydrogen ions in said forming is $0.5 \times 10^{17}$ atoms/cm$^2$ or above.

4. The method according to claim 3, wherein the dose of hydrogen ions in said forming is $1 \times 10^{17}$ atoms/cm$^2$ or above.

5. The method according to claim 4, wherein the dose of hydrogen ions in said forming is $3 \times 10^{17}$ atoms/cm$^2$ or below.

6. The method according to claim 1, wherein the transparent insulating substrate is one of a quartz substrate, a sapphire (alumina) substrate, a borosilicate glass substrate, and a crystallized glass substrate.

7. The method according to claim 1, wherein the single crystal silicon substrate is a substrate of nearly perfect crystal (NPC), single crystal silicon grown by a CZ method (Czochralski method) or a floating zone method (FZ method).

8. The method according to claim 1, wherein the surface treatment of said subjecting comprises at least one of plasma treatment and ozone treatment.

9. An SOI substrate manufactured by a method according to claim 1, wherein an RMS value for roughness of a peeled surface of the SOI layer is 10 nm or below.

10. The SOI substrate according to claim 9, wherein the RMS value is 6 nm or below.

* * * * *